(12) United States Patent
Enders et al.

(10) Patent No.: US 6,319,787 B1
(45) Date of Patent: Nov. 20, 2001

(54) METHOD FOR FORMING A HIGH SURFACE AREA TRENCH CAPACITOR

(75) Inventors: Gerhard Enders, Glen Allen; Matthias Ilg, Richmond, both of VA (US); Dietrich Widmann, Unterhaching (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/107,980

(22) Filed: Jun. 30, 1998

(51) Int. Cl.[7] ............................................... H01L 21/20
(52) U.S. Cl. ...................... 438/386; 438/239; 438/243; 438/249; 438/392
(58) Field of Search .................................. 438/239, 243, 438/249, 381, 386, 392, 244–248, 387–391

(56) References Cited

U.S. PATENT DOCUMENTS

| | | | |
|---|---|---|---|
| 5,244,824 | * 9/1993 | Sivan | 437/52 |
| 5,595,926 | * 1/1997 | Tseng | 437/52 |
| 5,677,225 | * 10/1997 | Park | 437/60 |
| 6,022,786 | * 2/2000 | Franosch et al. | 438/398 |
| 6,077,739 | * 6/2000 | Chang | 438/243 |

* cited by examiner

Primary Examiner—Matthew Smith
Assistant Examiner—Craig P. Lytle
(74) Attorney, Agent, or Firm—Stanton C. Braden

(57) ABSTRACT

A trench capacitor having a substrate with a trench extending therein with a nested, e.g., concentric, conductive regions disposed within the trench. A dielectric material is disposed within the substrate. The dielectric material has portions thereof disposed between the concentric conductive regions to dielectrically electrically separate one of the conductive regions from another one of the conductive regions. The dielectrically separated conductive regions provide a pair of electrodes for the capacitor. Selected ones of the concentric conductive regions are electrically connected to provide one of the electrodes for the capacitor. The substrate has a conductive region therein and one of the concentric conductive regions providing one of the electrodes is electrically connected to the conductive region in the substrate. One of the concentric conductive regions is electrically connected to a conductive region in the substrate through a bottom portion of the trench.

3 Claims, 9 Drawing Sheets

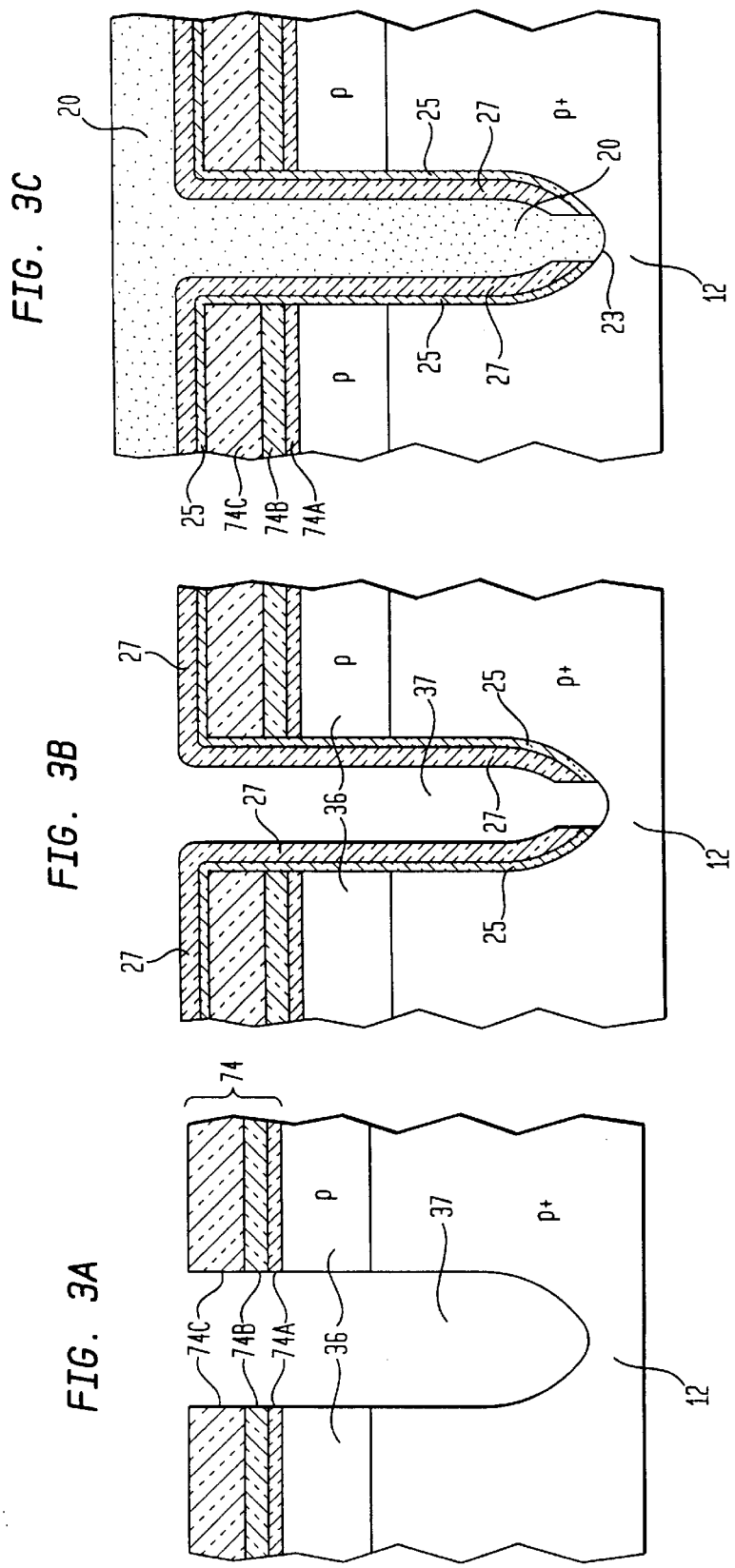

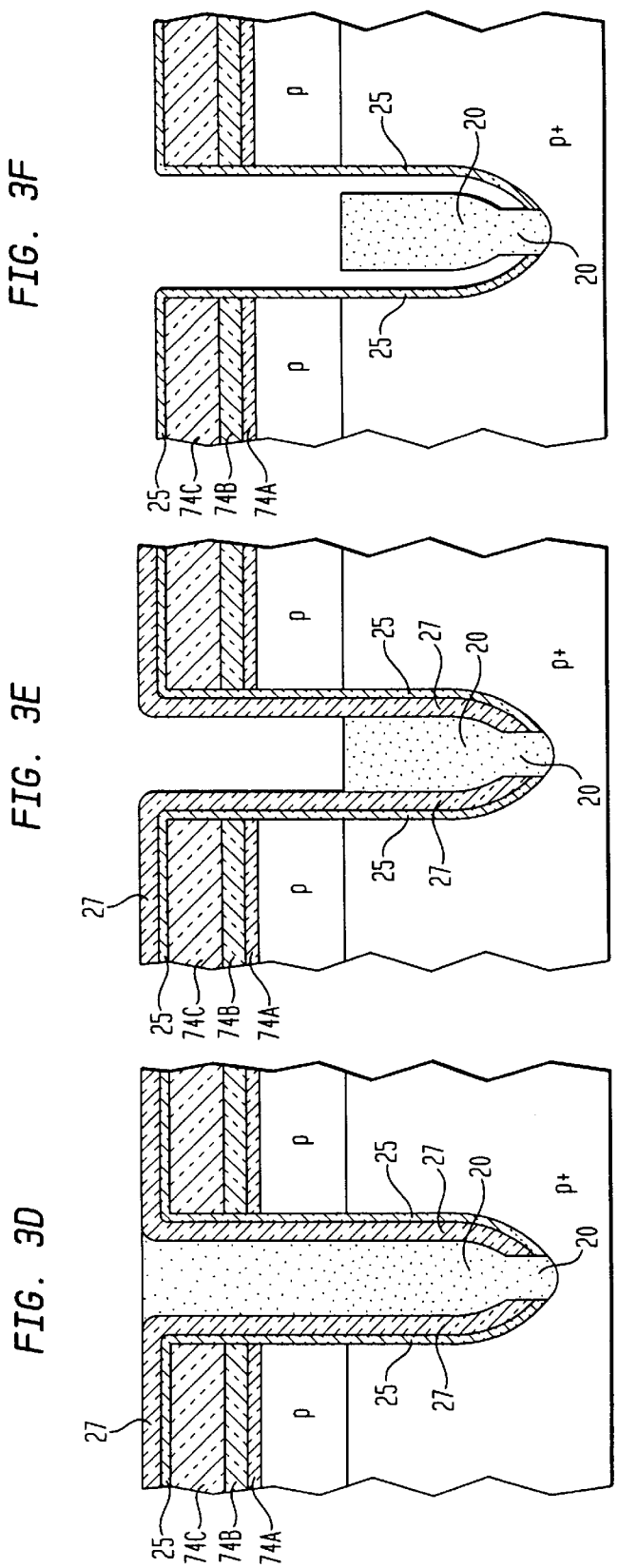

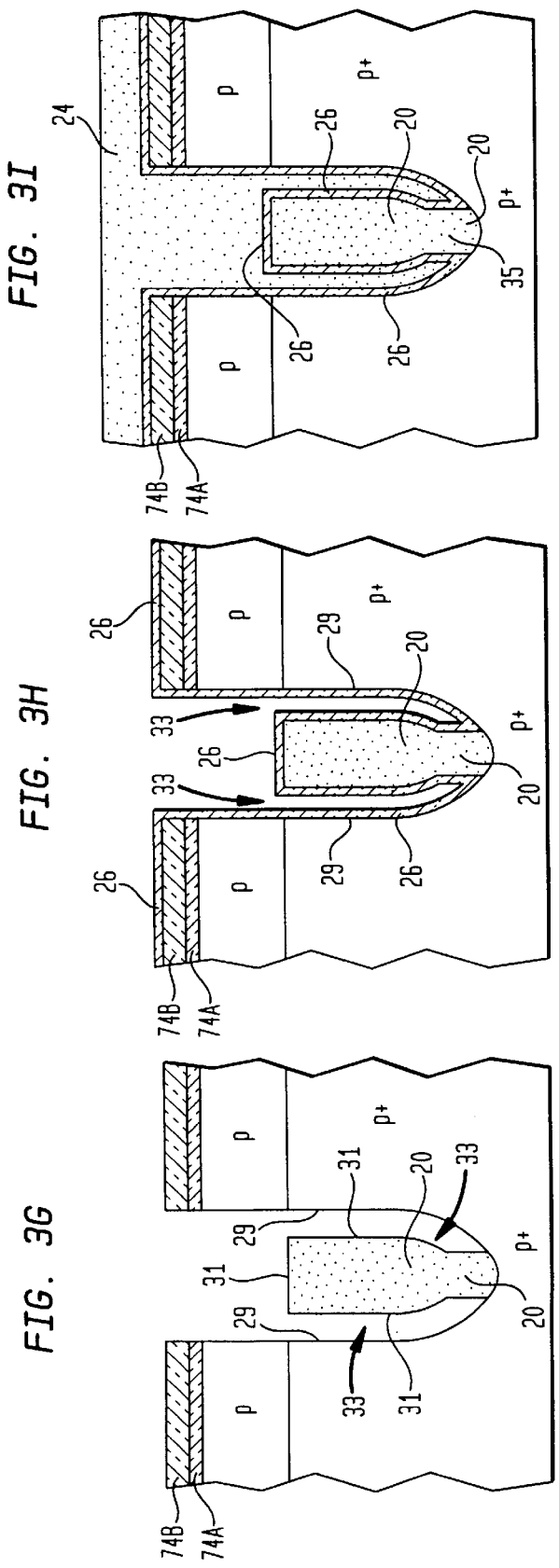

METHOD FOR FORMING A HIGH SURFACE AREA TRENCH CAPACITOR

BACKGROUND OF THE INVENTION

This invention relates generally to trench capacitors and more particularly to trench capacitors adapted for use with Dynamic Random Access Memories (DRAMs).

As is known in the art, a challenge in current DRAM technology is to provide smaller and smaller feature sizes to thereby increase the number of storage cells in a given surface space of a chip and yet provide such storage cell with a capacitor of sufficient size to store, and maintain, a requisite amount of charge. One approach currently being investigated is to use dielectric materials for the capacitor having high dielectric constants. Other approaches seek to enhance the total surface area of the capacitor structure by modifying the geometrical layout of the storage cell.

SUMMARY OF THE INVENTION

In accordance with the invention, a method is provided for forming a trench capacitor. The method includes providing a substrate with a trench extending into the substrate. One conductive region is formed nested within a second conductive region, both conductive regions being disposed within the trench. Portions of a dielectric material are disposed between the conductive regions to dielectrically separate one of the conductive regions from another one of the conductive regions. The dielectrically separated conductive regions provide a pair of electrodes for the capacitor.

With such method, because the conductive regions used to provide the electrodes of the capacitor are nested one within the other, a trench capacitor is provided having increased capacitance within a substantially constant surface area of the substrate.

In accordance with another feature of the invention, the method includes the step forming the plurality of conductive regions as concentric conductive regions.

In accordance with another feature of the invention, the substrate is provided with a conductive region therein. One of the concentric conductive regions providing one of the electrodes for the capacitor is electrically connected to the conductive region through a bottom portion of the trench.

In accordance with another feature of the invention, the electrically connecting step includes the step of out-diffusing dopant in an electrically conductive region formed in the trench to the conductive region in the substrate.

In accordance with another feature of the invention, a method for forming a trench capacitor is provided. A trench is formed in a substrate. A sacrificial material is deposited over sidewalls of the trench. A conductive material is deposited over the sacrificial material to provide an electrode for the capacitor. The sacrificial material is removed exposing peripheral portions of the conductive material and sidewall portions of the trench with the removed sacrificial material forming an open region disposed between the sidewalls and the exposed peripheral portions of the conductive material. A dielectric material is applied to the exposed peripheral portions of the conductive material and to the sidewall portions of the trench to line such open region with such dielectric material. A conductive material is introduced into the dielectric lined open region to provide another electrode for the capacitor.

In accordance with another feature of the invention, a trench capacitor is provided having a substrate with a trench therein. A dielectric material is disposed on sidewalls of the trench. A first conductive material having a hollow region therein is provided, such first conductive material having outer peripheral portions disposed on the first dielectric material and providing a first electrode for the capacitor. A second dielectric material having a hollow region therein is provided, such second dielectric material being disposed on inner peripheral portions of the first conductive material. A second conductive material is disposed within the hollow region in the second dielectric material to provide a first electrode for the capacitor.

In accordance with another feature of the invention, the substrate has a conductive region therein and the first electrode is in electrical contact with the conductive region.

In accordance with still another feature of the invention, a substrate is provided having a doped region. A trench is formed in the substrate. Sidewalls of the trench are covered with a dielectric material. A conductive material is formed in the trench over the dielectric material with a portion of the conductive material being in contact with the doped region of the substrate.

In accordance with another feature of the invention, a trench capacitor is provided having a substrate with a trench therein. A conductive material is disposed within the trench to provide a first electrode of the capacitor. A first dielectric material is disposed on sidewalls of the conductive material. A conductive material is disposed on the first dielectric material to provide a second electrode for the capacitor. A second dielectric material is disposed between the conductive material providing the second electrode and sidewalls of the trench.

In accordance with another feature of the invention, one of the concentric conductive regions providing one of the electrodes for the capacitor is electrically connected to the conductive region through a bottom portion of the trench.

In accordance with another feature of the invention, a trench capacitor is provided having a substrate with a trench extending therein. A plurality of nested conductive regions is disposed within the trench. A dielectric material is disposed within the substrate. The dielectric material has portions thereof disposed between the nested conductive regions to dielectrically electrically separate one of the conductive regions from another one of the conductive regions. The dielectrically separated conductive regions provide a pair of electrode for the capacitor.

In accordance with another feature of the invention, selected ones of the nested conductive regions are concentric.

In accordance with another feature of the invention, the substrate has a conductive region therein and one of the concentric conductive regions providing one of the electrodes is electrically connected to the conductive region in the substrate.

In accordance with another feature of the invention, selected ones of the concentric conductive regions are electrically connected to provide one of the electrodes for the capacitor and the electrically connected concentric regions are electrically connected to the conductive region in the substrate.

BRIEF DESCRIPTION OF THE DRAWING

Other features of the invention, as well as the invention itself, will become more readily apparent from the following detailed description when read together with the accompanying drawings, in which:

FIGS. 3A–3I are diagrammatical cross-sectional sketches of the trench capacitor according to the invention at various stages in the fabrication thereof.

DESCRIPTION OF THE PREFERRED EMBODIMENTS

Figure 1:
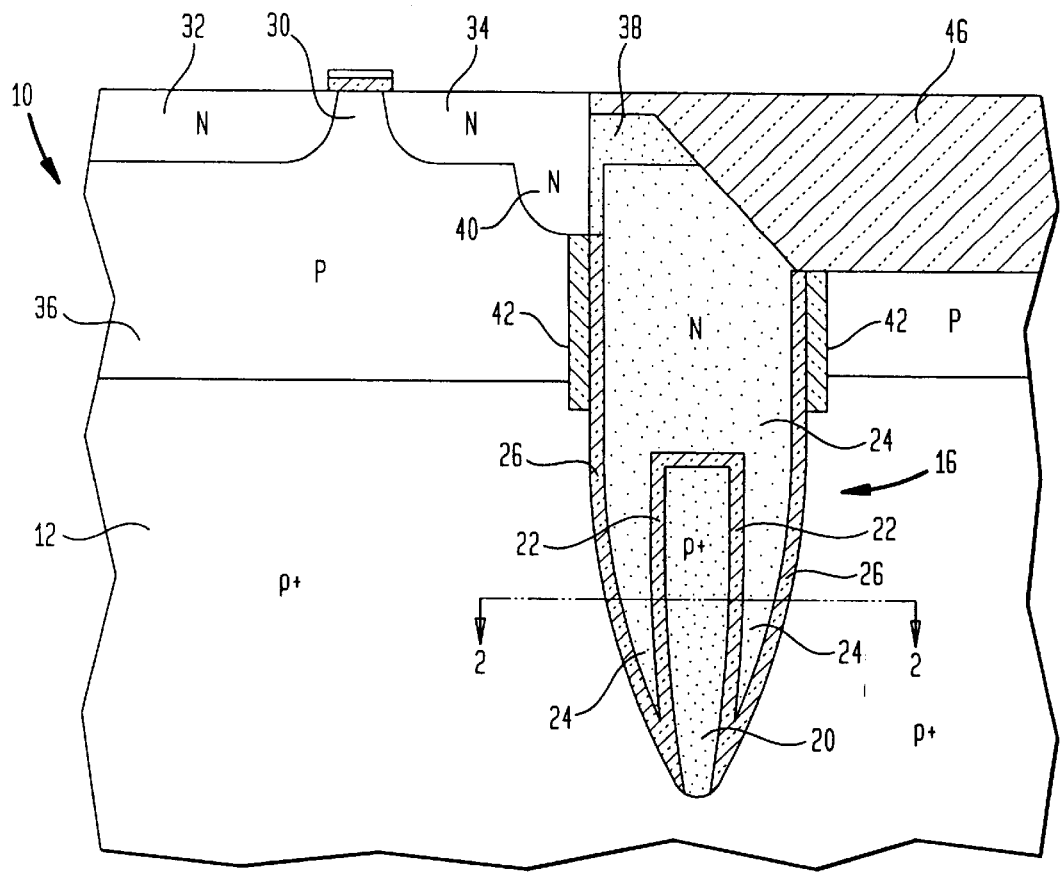
FIG. 1 is a diagrammatical cross-sectional sketch of a DRAM cell having a trench capacitor according to the invention.
Figure 2:
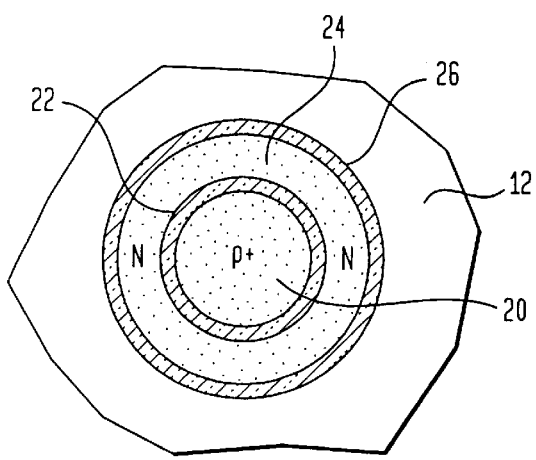
FIG. 2 is a cross-sectional of a portion of the DRAM cell capacitor of FIG. 1, such cross-section being taken along line 2—2 in FIG. 1.

Referring now to FIGS. 1 and 2, a DRAM cell 10 is shown formed in a silicon substrate 12, here having p+ type doping conductivity. The DRAM cell 10 includes a MOSFET 14 connected to a capacitor 16. The capacitor 16 is a trench capacitor. A conductive material 20, here p+ type conductivity doped polycrystalline silicon, is disposed within the trench in a manner to be described, to provide a first electrode of the capacitor 16. A first dielectric material 22, here silicon nitride is disposed, in a manner to be described, on sidewalls of the conductive material 20. Another conductive material 24, here n type conductivity doped polycrystalline silicon, is disposed, in a manner to be described, on the first dielectric material 22 to provide a second electrode for the capacitor 16. A second dielectric material 26, here also silicon nitride, is disposed between the conductive material 24 and the sidewalls of the trench in a manner to be described. Here, the substrate 12 has a conductive region therein, here the p+ type conductivity substrate, and the first electrode provided by conductive material 20 is in electrical contact with the conductive region, i.e., here the substrate 12.

Thus, the trench capacitor 16 includes a conductive region 20 which is nested within conductive region 24, both regions 20, 24 being disposed within the trench. The dielectric material 22 is disposed within the substrate 12 with portions thereof disposed between the concentric conductive regions 20, 24 to dielectrically electrically separate one of the conductive regions 20, 24 from another one of the conductive regions 20, 24. The dielectrically separated conductive regions 20, 24 provide a pair of electrodes for the capacitor 16. It is noted that the p+ conductive region 20 is disposed on (i.e., in electrical contact with) the p+ substrate 12 through the bottom portion of the trench.

To put it another way, the trench capacitor 16 includes a plurality of conductive regions 20, 24 disposed within the trench. The dielectric material 22, 26 is disposed within the substrate with portions 22 thereof disposed between the conductive regions 20, 24 to dielectrically separate one of the conductive regions 20 from another one of the conductive regions 24. The dielectrically separated conductive regions 20, 24 provide a pair of electrodes for the capacitor 16. Portions of one of the pair of conductive regions 24, here lower portions of conductive region 24, are disposed about portions of the other one of the concentric regions, here region 20, to form a pair of concentric conductive regions 20, 24 which provide a pair of the electrodes for the capacitor 16.

More particularly, the transistor 14 includes a gate region 30 and source/drain regions 32, 34. The source/drain regions 32, 34, which are separated by the gate, or channel, region 30, are formed by implanting dopant such as phosphorous into selected surface portions of the p type conductivity epitaxial layer 36 formed on the substrate 12. A node region 38, referred to as a "node junction" couples the capacitor 16 to the transistor 14. The "node junction" diffusion region is formed by out-diffusing the dopants from the trench polycrystalline silicon conductive material 24 through a buried strap 40.

A dielectric collar 42, here silicon dioxide, is formed at the upper portion of the trench, as indicated. The collar 42 prevents leakage of the "node junction" 38, and strap 40 to the buried plate, here provided by the p+ substrate 12. Leakage is undesirable as it degrades the retention time of the DRAM cell 10, increasing the refresh frequency which adversely impacts performance.

A buried well, not shown, comprising n-type dopants, such as phosphorous or arsenic, may be provided below the surface of the substrate 10. The buried well serves to connect the buried plates of other DRAM cells in an array, not shown. A Shallow Trench Isolation (STI) 46 is provided to isolate the DRAM cells, not shown, formed in the substrate 12.

Referring now to FIGS. 3A–3I, the method for forming the trench capacitor 16 (FIGS. 1 and 2) will be described. Thus, referring to FIG. 3A, the silicon, semiconductor p+ type conductivity substrate 12 is provided. Here the substrate 12 has a p type conductivity epitaxial layer 36. A pad stack 74 of a lower layer 74a of thermally formed silicon dioxide, an intermediate layer 74b of low pressure chemical vapor deposited silicon nitride, and an upper layer 74c of oxide, for example low pressure chemically vapor deposited TEOS or borosilicate doped glass (BSG), is formed on the surface of the silicon substrate 10. As noted above, the substrate 12 is doped with p type conductivity dopant, here (p+), such as boron. The substrate 12 has the more lightly doped p type conductivity epitaxial layer 36. The pad stack 74 is patterned using conventional photolithography to define a region in which a trench 37 for the capacitor is to be formed.

After forming the trench 37, here using a plasma etching process, in the substrate 12, as shown, the sidewalls of the trench 37 are lined with low pressure chemically vapor deposited silicon nitride layer 25, here to a thickness of about 5 nanometers (nm), as shown in FIG. 3B. It should be noted that any type of nitride may be used which can be deposited with sufficient conformality.

Next a sacrificial material 27, here chemically vapor deposited phosphorus doped silicate glass (PSG), or other doped silicate glass is deposited over the surface of the layer 25, as shown in FIG. 3B. A plasma etch (reactive ion etch, RIE, here using a $CF_4$ combined with $CHF_3$ and argon) is used to remove bottom portions of the PSG material 27 and the silicon nitride layer 25, as shown in FIG. 3B.

Referring now to FIG. 3C, the sidewall lined trench is then filled with the conductive material 20, here boron doped polycrystalline silicon (i.e. p+ doped poly) to provide an electrode for the capacitor 16 (FIGS. 1 and 2). It is noted that the bottom portion 23 of the doped poly material 20 becomes deposited onto, and in electrical contact with, the underlying portion of the silicon substrate 12.

Next, and referring also to FIG. 3D, upper portions of the p+ doped polycrystalline silicon 20 are removed using chemical mechanical polishing, or a reactive ion etch back, as indicated. Referring to FIG. 3E, the upper portions of the polycrystalline silicon 20 are then recess etched, as shown.

Referring now to FIG. 3F, a wet etch, here for example, an hydrofluoric acid based etch, is used to selectively remove the sacrificial PSG material 27. It is noted that other oxides may be used which have enough selectivity for the deep trench etching step and which can be removed by a wet etch. Thus, the oxide may be any type which exhibits high wet etch selectivity to doped polycrystalline silicon and nitride.

It is noted that, referring again to FIG. 3D, after the upper portions of the p+ doped polycrystaliine silicon 20 are removed, the upper portions of the silicon nitride layer 25 and the upper portions of the sacrificial layer 27 may be removed using chemical mechanical polishing or reactive ion etching thereby exposing the TEOS or BSG layer 74c. Then, a wet etch, here for example, an hydrofluoric acid based etch, is used to selectively remove any remaining portions sacrificial PSG material 27. The upper portions of the polycrystalline silicon 20 are then recess etched.

Referring to FIG. 3G, if the silicon nitride layer 25 is not removed, as described above, a wet etch is used to remove the silicon nitride layer 25. The TEOS/BSG mask 74c (FIG. 3A) is etched away. In either case, after removal of any remaining PSG sacrificial material 27, it is noted that the silicon sidewalls 29 of the trench and peripheral portions 31 of the conductive material, i.e., the doped polycrystalline silicon 20, have an open region 33 therebetween.

Referring now to FIG. 3H, the node dielectric layer 26 is formed by low pressure chemical vapor deposition of a 5 nm thick layer of silicon nitride followed by a wet oxidation to form the node dielectric layer 26 over the exposed portions of the sidewalls 29 of the trench formed in the silicon 12 and over the peripheral portions 31 of the doped polycrystalline silicon 20, as shown in FIG. 3H.

Referring now to FIG. 3I, the n+ doped polycrystalline silicon conductive material 24 is introduced into the silicon nitride lined open region 33 (FIG. 3G) to provide another electrode for the capacitor 16 (FIGS. 1 and 2). As noted above, the conductive material 20 is electrically connected to the p+ substrate 12 through the bottom portion 35 of the trench 37 (FIG. 3A) and that the conductive material 24 is electrically isolated from conductive material 20 by the dielectric layer 26. The structure shown in FIG. 3I is then processed in a conventional manner to provide the DRAM cell 10 shown in FIG. 1. It is noted that the conductive material 24 is electrically connected to one of the source/drain regions 34 through the strap 40 and "node junction" 38, as shown and discussed above in connection with FIG. 1. (It should be noted that while, when discussing FIGS. 1 and 2 above, the dielectric material around the conductive material 24 was referred to as dielectric layers 22 and 26, it is now understood that such layers 22, 26 are formed as a single layer designated above as layer 26.)

It should be noted that the doped polycrystalline silicon material 20, 24 may be other than boron doped polycrystalline silicon. The material should be conductive and withstand subsequent processing steps. If doped poly is used for material 20 it should be compatible with the doping type of the substrate 12. Further, other types of dielectric material may be used such as, for example, $Ta_2O_5$.

Figure 4A:
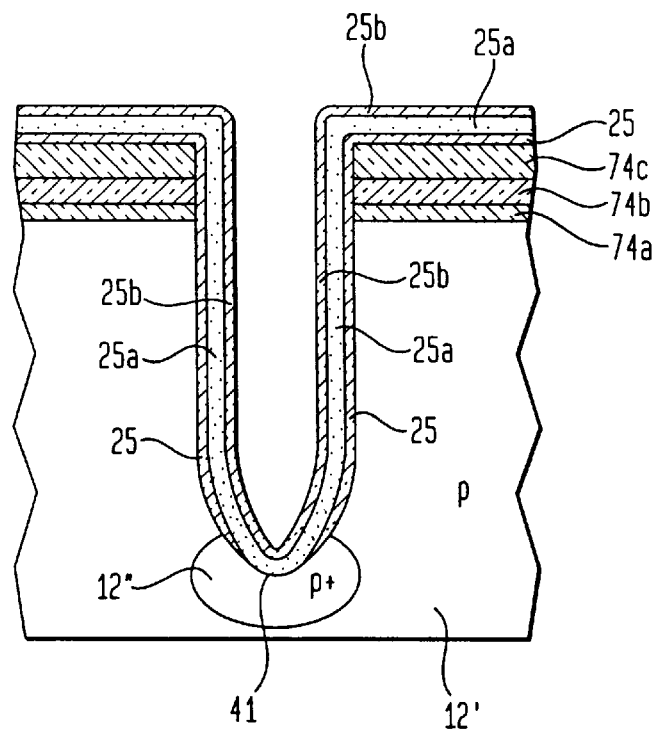
FIGS. 4A and 4B are diagrammatical sketches of steps used to form the trench capacitor according to another embodiment of the invention.
Figure 4B:
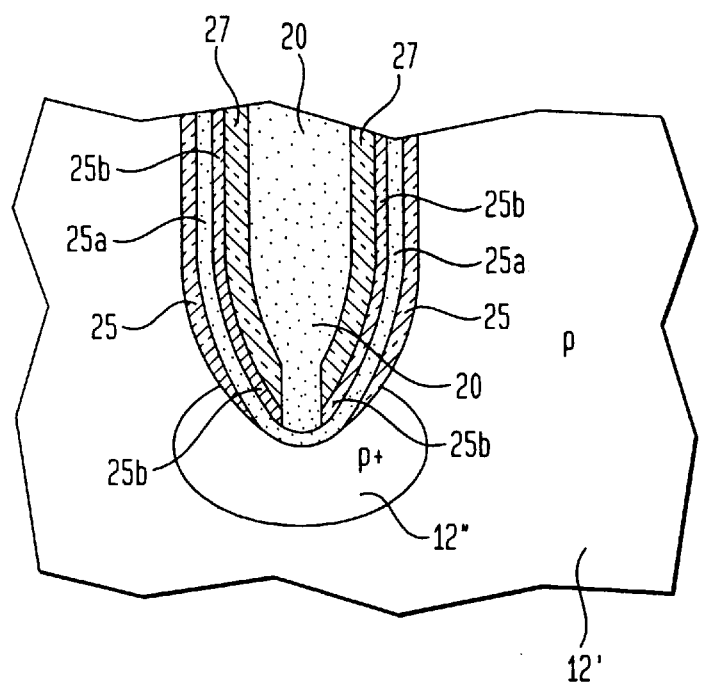

Referring now to FIGS. 4A and 4B, an alternative embodiment is shown. Such alternative embodiment may be used when an epitaxial layer is not provided. Thus, here a p type conductivity silicon substrate 12' is provided. The substrate 12' is processed as described above in connection with FIG. 3A. Thus, the silicon nitride layer 25 is low pressure chemically vapor deposited over the sidewalls of the trench 37 (FIGS. 3A and 3B) as shown in FIG. 4A. The bottom portion of the silicon nitride layer is etched using a reactive ion etch (RIE) to expose a portion 41 of the silicon substrate 12'. Next, a layer of boron doped polycrystalline silicon 25a is deposited over the silicon nitride layer 25, as indicated. Here the layer of boron doped polycrystalline silicon 25a is deposited uniformly over the surface of the silicon nitride layer 25 to a thickness of about 10 nm. It is noted that the bottom portion of the boron doped polycrystalline silicon layer 25a is in contact with the portion 41 of the silicon substrate 12'.The structure is then heated to a temperature of about 800° C. for a sufficient time to outdiffuse boron dopant in the boron doped polycrystalline silicon layer 25a and thereby create a p+ doped region 12" in the silicon substrate 12', as indicated in FIG. 4A. Thus, the boron doped polycrystalline silicon layer 25a is a an outdiffusion source of dopant used to form region 12".

Next, a silicon nitride layer 25b, here about 6 nm, is low pressure chemically vapor deposited to a thickness of about 5 nm over the boron doped polycrystalline silicon layer 25a as described above in connection with FIG. 3B for layer 25. Next, the sacrificial material 27, here chemically vapor deposited phosphorus doped silicate glass (PSG), or other doped silicate glass, here to a thickness of 30 nm, is deposited over the surface of the dielectric layer 25a, as shown in FIG. 4B and as described above in connection with FIG. 3B. Next, the bottom portions of layer 27 and 25a are etched to expose the doped polycrystalline silicon layer 25a, as shown in FIG. 4B. Next, the trench is filed with conductive material 20, here p+ type conductivity doped polycrystalline silicon, as shown in FIG. 4B and as described in connection with FIG. 3C. It is noted that the doped polycrystalline silicon material 20 is electrically connected to the p+ region 12" through the layer 25a. The structure is then processed as described above in connection with FIGS. 3D through 3I.

Referring now to FIGS. 5A through 5H, another alternative embodiment of the invention is shown. Thus, referring to FIG. 5A, after forming the structure shown in FIG. 3F, a sacrificial layer $27_1$ is deposited over silicon nitride layer 25 and the boron doped polycrystalline silicon 20. Here, the sacrificial layer $27_1$ is the same material used for layer 27 described above in connection with FIG. 3E.

Figure 5A:
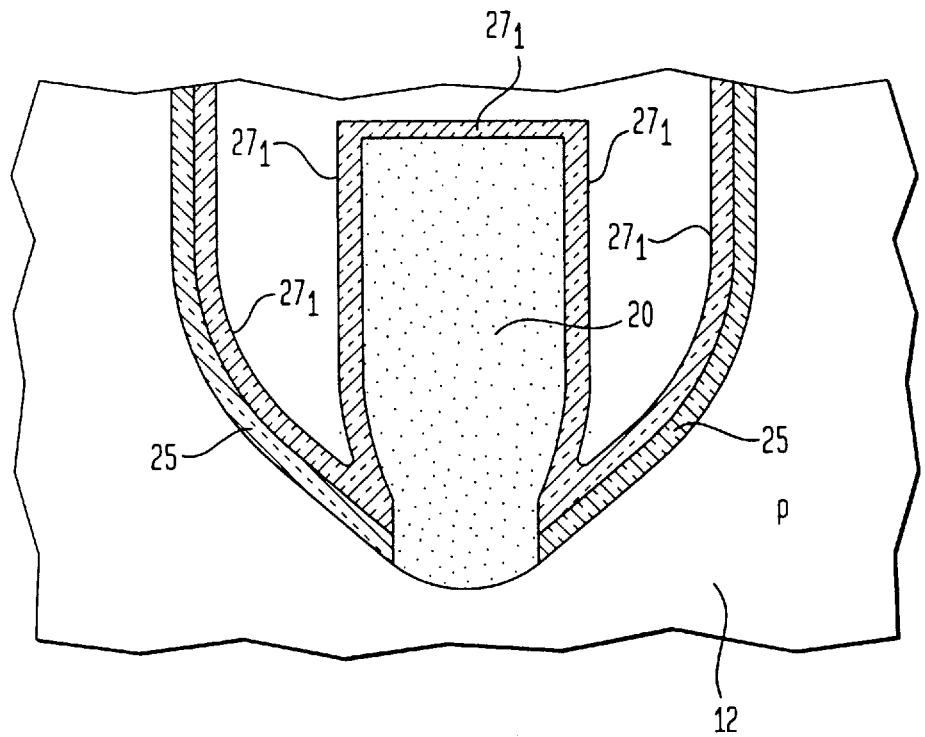
FIGS. 5A through 5H are diagrammatical sketches of steps used to form the trench capacitor according to another embodiment of the invention.
Figure 5B:
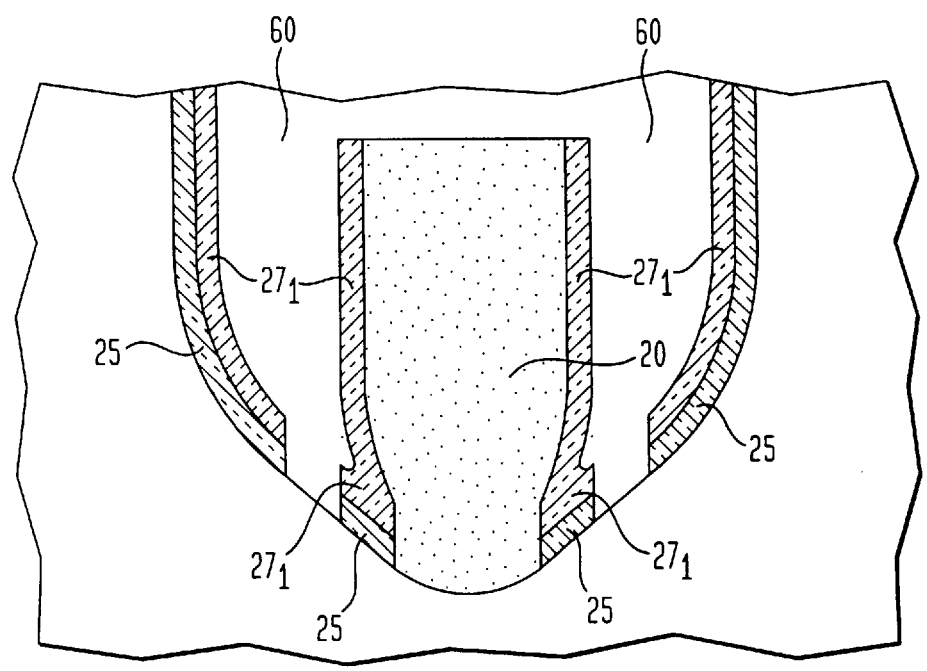
Figure 5C:
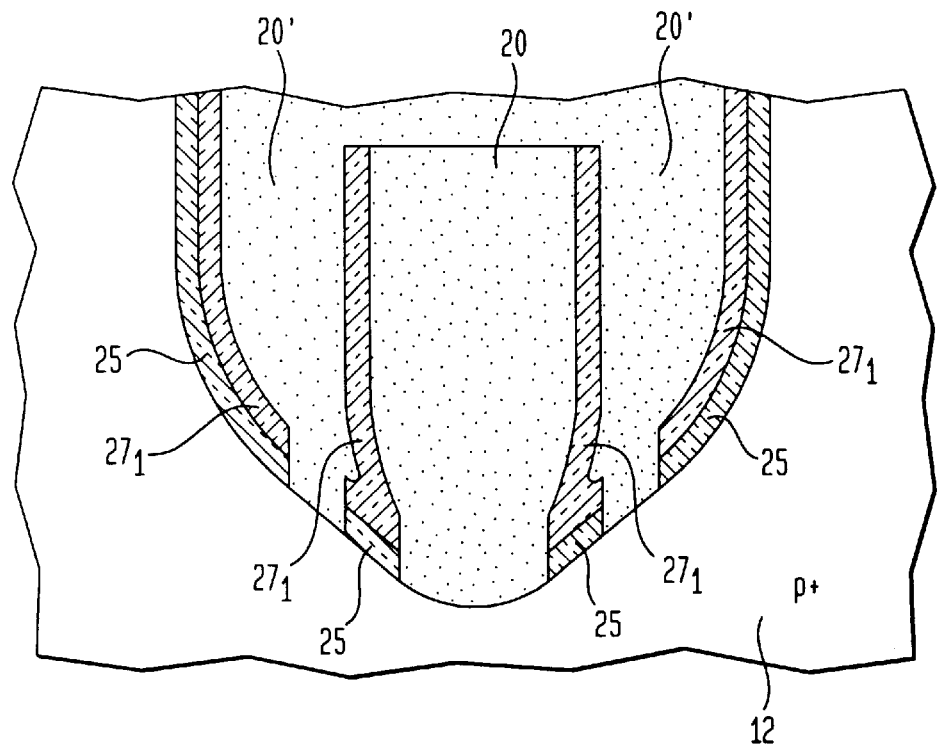

Next, RIE is used to open bottom portions of the layer $27_1$ and layer 25 and also remove the portion of layer $27_1$ over the top surface of the poly layer 20, as shown in FIG. 5B. Next, referring to FIG. 5C, boron doped polycrystalline silicon 20' is deposited over the structure and into the space 60 shown in FIG. 5B. It is noted that the upper portions of boron doped poly silicon 20 is in contact with portions of boron doped poly silicon 20'. It is also noted that bottom portions of the boron doped poly silicon 20' are in contact with the p+ substrate 12.

Next, referring to FIG. 5D, the upper portions of the doped poly silicon 20' are etched to a level at, or below, the upper level of the doped poly silicon 20. It is noted however, that doped poly silicon 20' and doped poly silicon 20 are electrically connected through the p+ substrate 12.

Figure 5D:
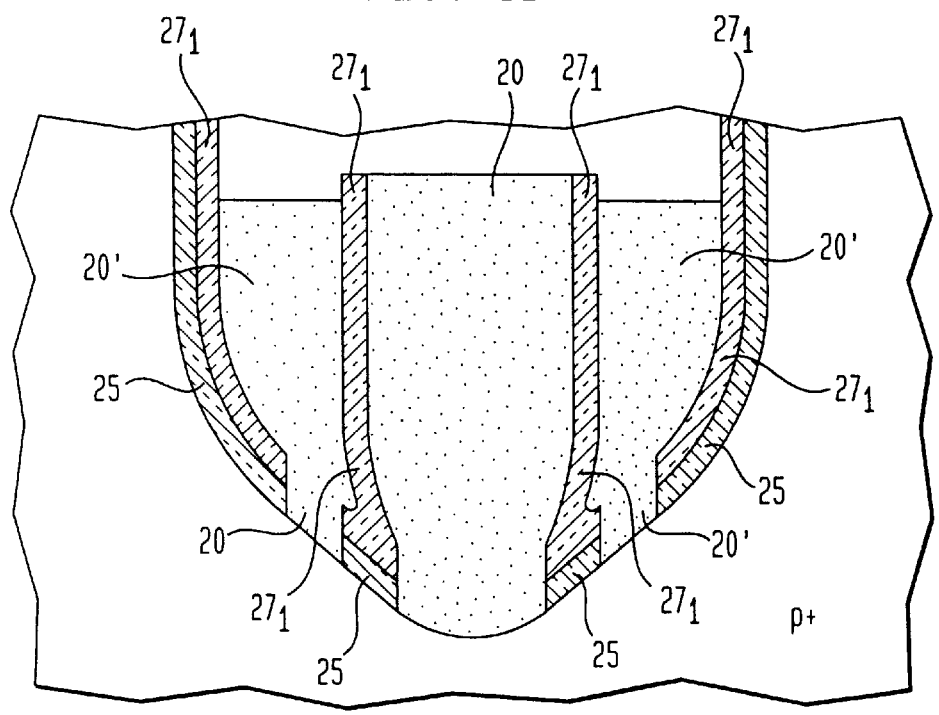
Figure 5E:
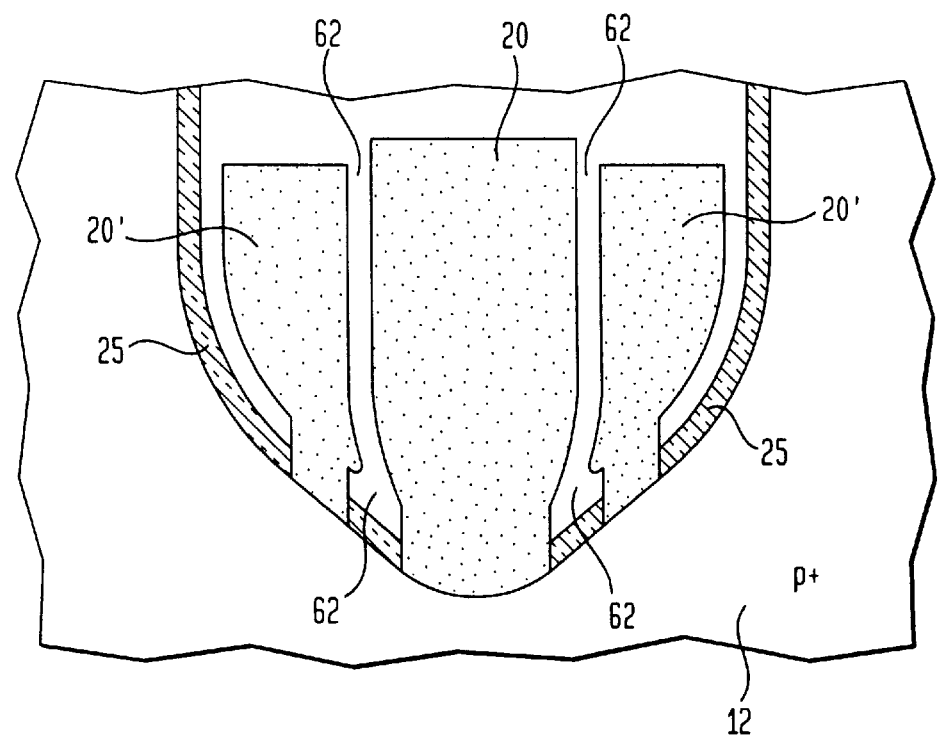
Figure 5F:
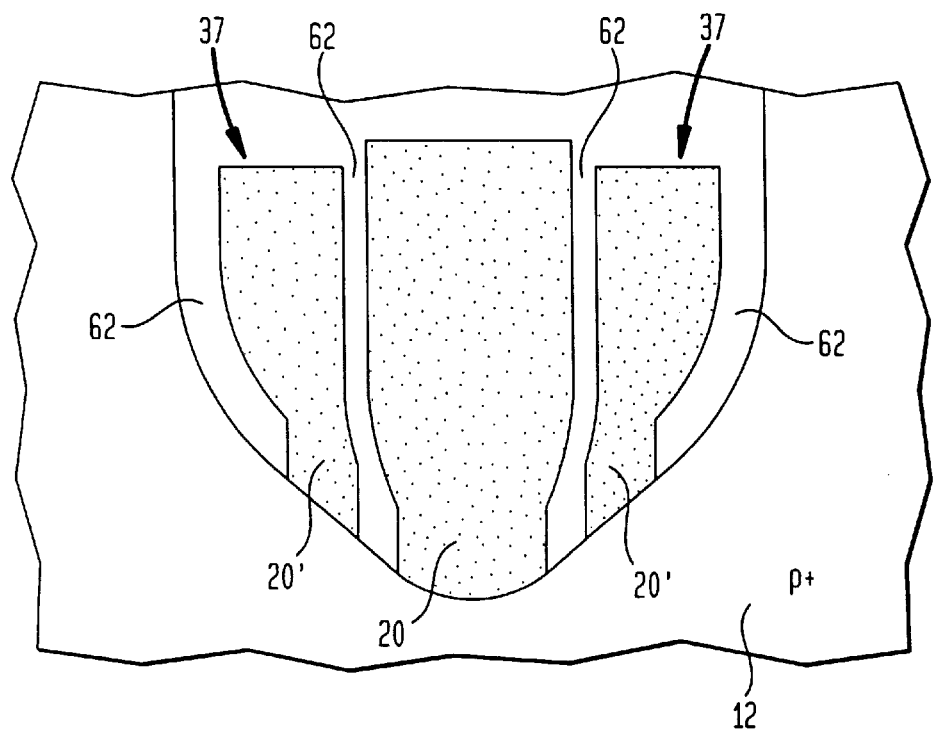

Next, the sacrificial material $27_1$ shown in FIG. 5D is etched to produce the structure shown in FIG. 5E. Thus, spaces 62 are formed after the removal of the sacrificial material $27_1$. Next, the silicon nitride layer 25 is etched to produce the structure shown in FIG. 5F. It is noted that spaces 62 are thus formed which regions expose the sidewalls of the trench 37 and the outer peripheral walls of the doped poly silicon 20' and doped poly silicon 20.

Figure 5G:
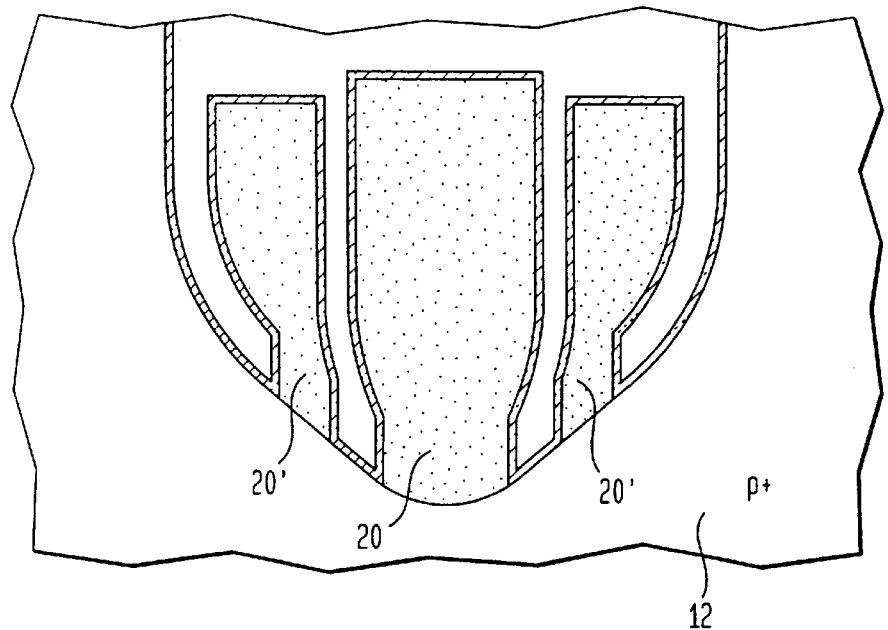

Next, a layer 26 of silicon nitride is deposited over the exposed sidewalls of the trench 37 and the outer peripheral walls of the doped poly silicon 20' and doped poly silicon 20 to form the node dielectric for the capacitor, as shown in FIG. 5G. More particularly, the node dielectric layer 26 is formed by low pressure chemical vapor deposition of a 5 nm thick layer of silicon nitride followed by a wet hydrochloric acid oxidation to form the silicon oxynitride node dielectric layer 26 over the exposed portions of the sidewalls of the trench formed in the silicon 12 and over the peripheral portions of the doped polycrystalline silicon 20, 20' as described in connection with FIG. 3H.

Figure 5H:
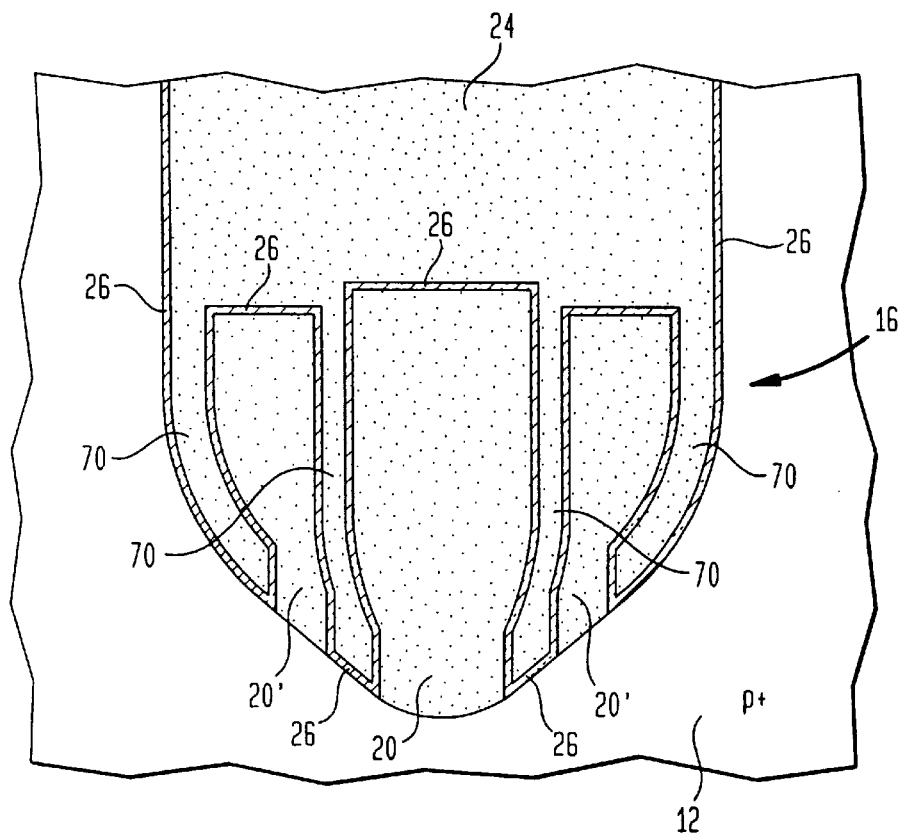

Referring now to FIG. 5H, the here n type conductivity doped polycrystalline silicon 24 is deposited over the structure. The structure is then processed as described above in connection to form the DRAM cell 10 shown and described above in connection with FIG. 1. It is noted that in FIG. 5H, the conductive regions 20 and 20' are electrically connected through the $p^+$ substrate 12 and thus form one of the two electrodes of the capacitor 16'. Further, these, in effect two electrically connected electrodes or plates of the capacitor 16' have interleaved therein four electrically connected electrodes or plates formed by regions 70 of the electrically conductive material 24 (i.e., the n type conductivity doped polycrystalline silicon 24).

Other embodiments are within the spirit and scope of the appended claims. For example, a bottle-shaped deep trench capacitor may be used. Here again, the bottom of the trench is open to enable the conductive material 20 to electrically connect to the doped silicon substrate. Further, the trench filled conductive material need not be doped polycrystalline silicon. Still further, additional electrically interconnected capacitor electrode than those shown in FIG. 5H may be formed by repeating the steps described above in connection with FIGS. 5A through 5H.

What is claimed is:

1. A method for forming a trench capacitor, comprising:
    (a) providing a substrate;
    (b) forming a trench in the substrate;
    (c) disposing a first sacrificial material over the sidewalls of the trench;
    (d) disposing a first conductive material over the first sacrificial material to provide a first conductive region;
    (e) removing portions of the first sacrificial material to provide a first open region between the sidewalls of the trench and sidewalls of the first conductive material;
    (f) lining the sidewalls of the trench and the sidewalls of the first conductive material with a second sacrificial material while proving a second open region between portions of the second sacrificial material disposed over the sidewalls of the trench and portions of the second sacrificial material disposed over the sidewalls of the first conductive region;
    (g) introducing a second conductive material into the second open region to provide a second conductive region;
    (h) removing the second sacrificial material providing:
        (i) a first space between an outer periphery of the first conductive region and an inner periphery of the second conductive region; and
        (ii) a second space between an outer periphery of the second conductive region and the sidewalls of the trench;
    (i) lining the outer periphery of the first conductive region and the inner periphery of the second conductive material and the outer periphery of the second conductive material and the sidewalls of the trench with a dielectric material to thereby line with such dielectric material the surfaces forming the first and second spaces; and
    (j) introducing a third conductive material into the lined first and second spaces, such third conductive material being electrically insulated from the first and second conductive materials.

2. The method recited in claim 1 wherein the provided substrate has a conductive region therein and including the step of forming the first and second conductive materials in electrical contact with each other through the conductive region in the substrate to provide a first electrode for the capacitor with the third conductive material providing a second electrode for the capacitor.

3. The method recited in claim 2 wherein the step of forming the second conductive material in electrical contact with the first conductive material comprises forming such electrical connection at a bottom portion of the trench.

* * * * *